(12) United States Patent
Hartley et al.

(10) Patent No.: US 6,369,396 B1
(45) Date of Patent: Apr. 9, 2002

(54) CALIBRATION TARGET FOR ELECTRON BEAMS

(75) Inventors: John G. Hartley, Fishkill; Timothy R. Groves, Poughkeepsie, both of NY (US); Rodney A. Kendall, Ridgefield, CT (US); Maris A. Sturans, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,350

(22) Filed: Sep. 29, 1999

(51) Int. Cl.⁷ .............................. G03F 9/00; G01N 1/28
(52) U.S. Cl. .................. 250/491.1; 250/398; 438/473; 438/49.4; 438/694
(58) Field of Search ................................. 250/309, 310, 250/399, 439, 439 R, 491.1, 398; 438/455, 584, 694, 689, 473, 494

(56) References Cited

U.S. PATENT DOCUMENTS 4,163,900 A    8/1979  Warren et al.

FOREIGN PATENT DOCUMENTS

JP    09-281692    * 10/1997

* cited by examiner

*Primary Examiner*—Sandra O'Shea
*Assistant Examiner*—Zia Hashmi
(74) *Attorney, Agent, or Firm*—Eric W. Petraske

(57) ABSTRACT

A scattering target for use in a particle beam system is formed from a grid of gold on a substrate of carbon, with an intermediate smoothing layer (e.g. copper) on the carbon to provide a surface sufficiently smooth to provide an adequate target. An optional bonding layer may be used to improve adhesion between the gold and the smoothing layer.

19 Claims, 4 Drawing Sheets

CALIBRATION TARGET FOR ELECTRON BEAMS

FIELD OF THE INVENTION

The field of the invention is particle beam systems, in particular, electron beam systems.

BACKGROUND OF THE INVENTION

When running electron beam or other particle beam systems, it is necessary to correct for drift, electrical and/or thermal, in the operating parameters of the system. Accordingly, it is conventional to direct the beam at a target in a known location and to correct the system parameters as required in order to restore correct operation of the system.

Conventionally, in the particular field of integrated circuit fabrication, the target is composed of a grid of gold on an integrated circuit wafer of silicon. Silicon is conventionally used because it is the material of the workpiece that is being operated on, so that the parameters of the target are similar to the operating parameters in system operation.

In particular, the surface of a silicon substrate will have the same degree of smoothness as the wafer being patterned.

The degree of smoothness is important because a high quality target image is needed to obtain an accurate calibration. If the surface is not smooth, the fidelity of the target image may be compromised, with large and random variations in the width, and even discontinuities if the surface topography is sufficiently rough. The depth of focus of an electron beam image is very small, being about a few microns for current technology. An out of focus beam will produce an exposed area of resist that is too large and may produce a discontinuity if the image is so diffuse that the development threshold of the resist is not met. Discontinuities may also be produced by step coverage problems.

U.S. Pat. No. 4,163,900 shows the use, in an X-ray analysis system, of a grid substrate that is cast from a composite material of low atomic number, including carbon fibers. The line widths used were about 150 $\mu$m, qualitatively different from today's line widths of about 150 nm by three orders of magnitude.

SUMMARY OF THE INVENTION

The invention relates to a calibration target for particle beam systems that employs carbon as the substrate, gold as the scattering material and an intermediate smoothing layer deposited on the substrate that brings the irregularities of the substrate within tolerance.

An alternative version of the invention employs a gold background carbon grid.

DESCRIPTION OF THE PREFERRED EMBODIMENT

Figure 1:
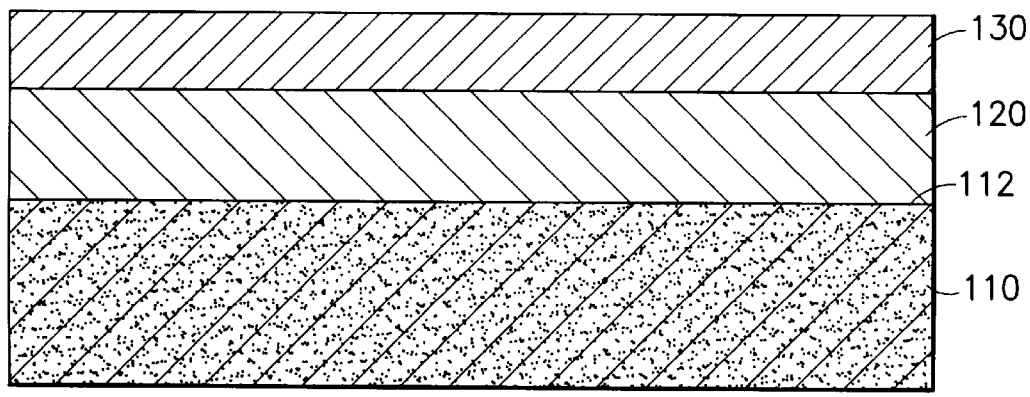
FIGS. 1–3 illustrate a cross section of a substrate and grid being fabricated.

Referring to FIG. 1, there is shown a portion of an amorphous carbon substrate 110 supplied by Barlo Carbon of Fairfield, NJ having an irregular top surface 112 that exceeds the limits of the e-beam system depth of focus. The surface finish is about 5 $\mu$m. The carbon plate, is made to the same dimensions as a standard four inch silicon wafer. It is not necessary that the substrate plate be entirely of carbon and a plate of silicon or other supporting material with a layer of carbon thick enough to suppress backscattering (about 40 $\mu$m if there is a high-Z material behind the carbon and about 3 $\mu$m when there is empty space behind it) might also be used.

In order to bring the surface within an acceptable range, a layer 120 of copper, nominally 15 $\mu$m thick has been formed by any convenient method, such as electroplating. Chemical vapor deposition or sputtering might also be used. The main criterion for the smoothing layer is that it bond well to carbon and to the high-z target layer. Other suitable materials are, for example, nonmagnetic materials such as silver or aluminum. After electroplating, copper layer 120 has a surface finish of less than one micron, which is adequate for this purpose. If the surface finish is not sufficient, then it may be polished in a conventional chemical-mechanical polish to achieve the required smoothness. Currently, a surface finish of about 0.2 $\mu$m is desirable and a finish of about 0.5 $\mu$m is acceptable.

A thin bonding layer of gold 130 about 20 nm thick has been electroplated on layer 120 in order to promote adhesion of the thick target layer of gold that will follow. Two plating steps are preferable in order to suppress oxide formation on the copper, which can inhibit further plating.

Figure 2:
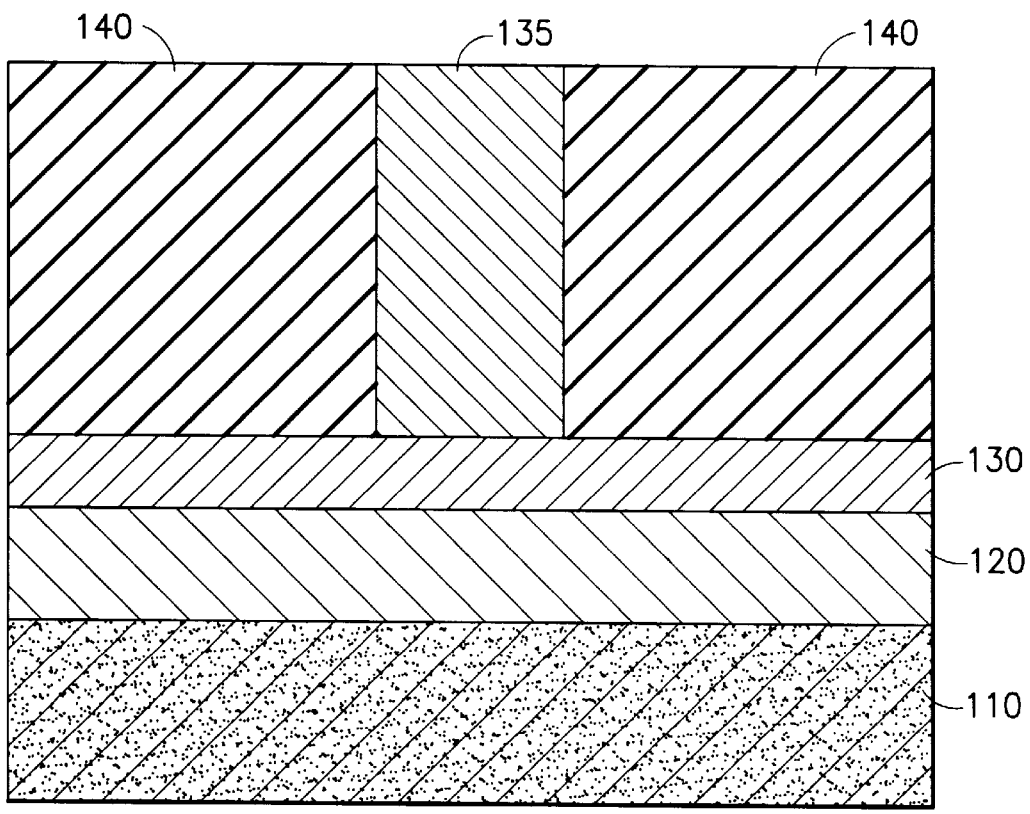

Next, in FIG. 2, we see the result of a second operation in which a layer 140 of positive photoresist has been put down and patterned to provide for an aperture down to bonding layer 130. A target layer 135 of gold has been electroplated in the aperture (and in other apertures not shown to make any desired target pattern). Tungsten is another high-Z material that may also be used for the thick layer. The thickness of layer 135 is illustratively 300 nm, but that is not critical and any thickness that gives a good contrast with the background scattering from the substrate is satisfactory.

Figure 3:
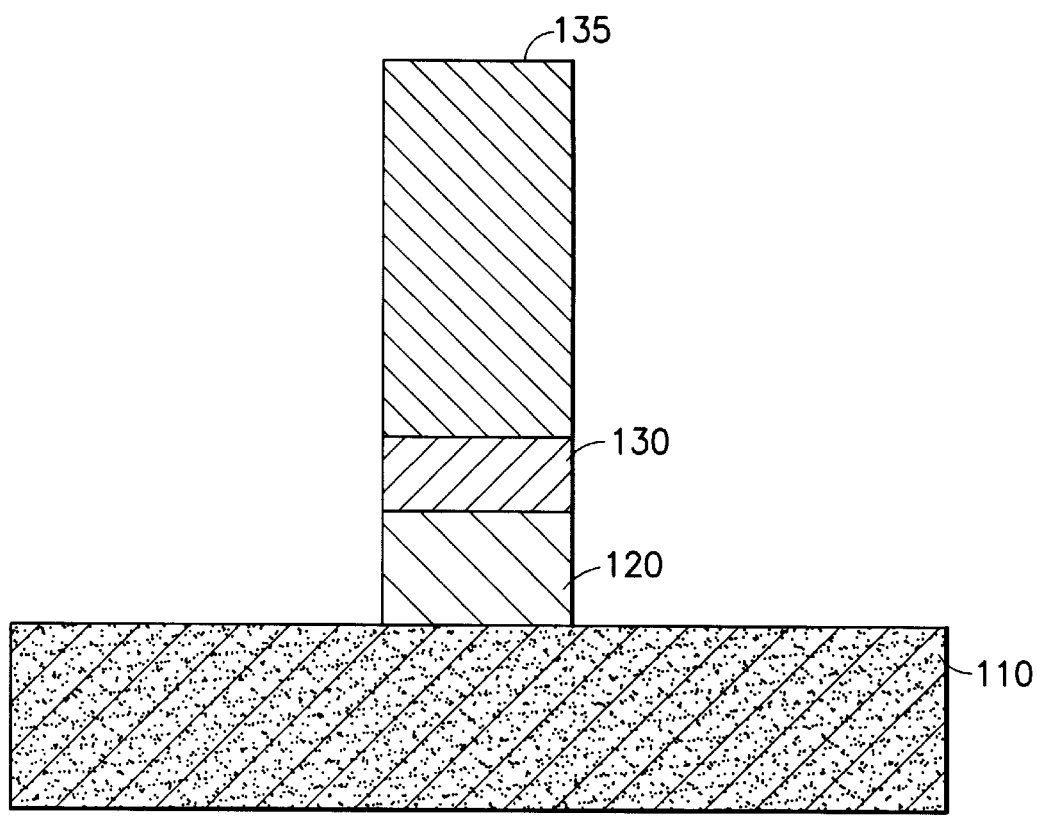

After resist 140 is stripped, the thin bonding layer 130 is etched in a bath of aqua regia and copper layer 120 is removed in nitric acid. There will be some material removed from layer 135, but its thickness is so great compared with the thickness of layer 130 that this removal is not significant. The result is shown in FIG. 3.

Carbon has the advantage for this application that it is a conductor, but a poor one. It is advantageous that the substrate be a conductor because electrons penetrating it will flow toward a ground connection, instead of being trapped, as they would in an insulating substrate. It is advantageous that the substrate be a poor conductor because a good conductor would generate eddy currents from the changing magnetic fields used to manipulate the beam that would spoil the beam focus. Additionally, the oxides of carbon are gases at room temperature, so that they do not trap electrons as silicon oxide does.

Unfortunately, it has not been possible to polish carbon to a sufficiently smooth surface of about 0.2 $\mu$m to be a suitable substrate. The carbon substrate used in the illustrative embodiment has a surface roughness of about 5 $\mu$m.

Other low Z materials that are solids at room temperature (beryllium, lithium, and boron) are not suitable. Lithium is highly reactive, beryllium is toxic, and boron is an insulator.

Figure 4:
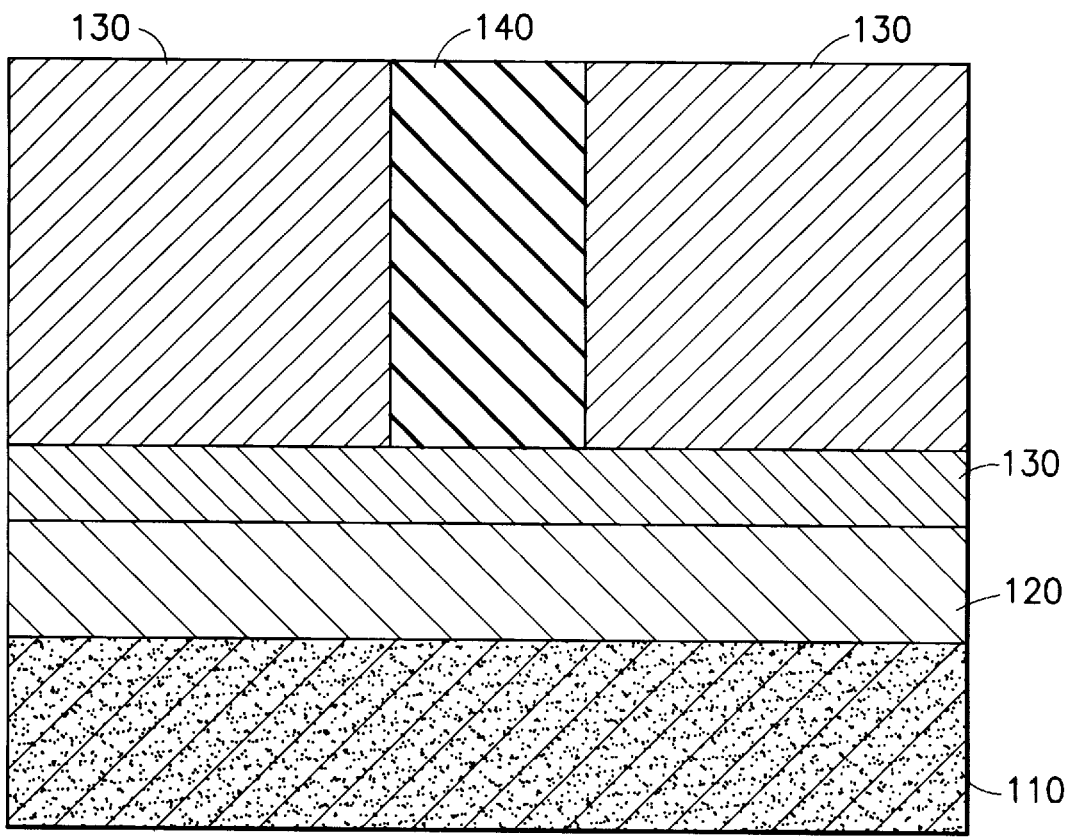
FIGS. 4 and 5 illustrate corresponding cross sections of a substrate and grid being fabricated in an alternative method.
Figure 5:
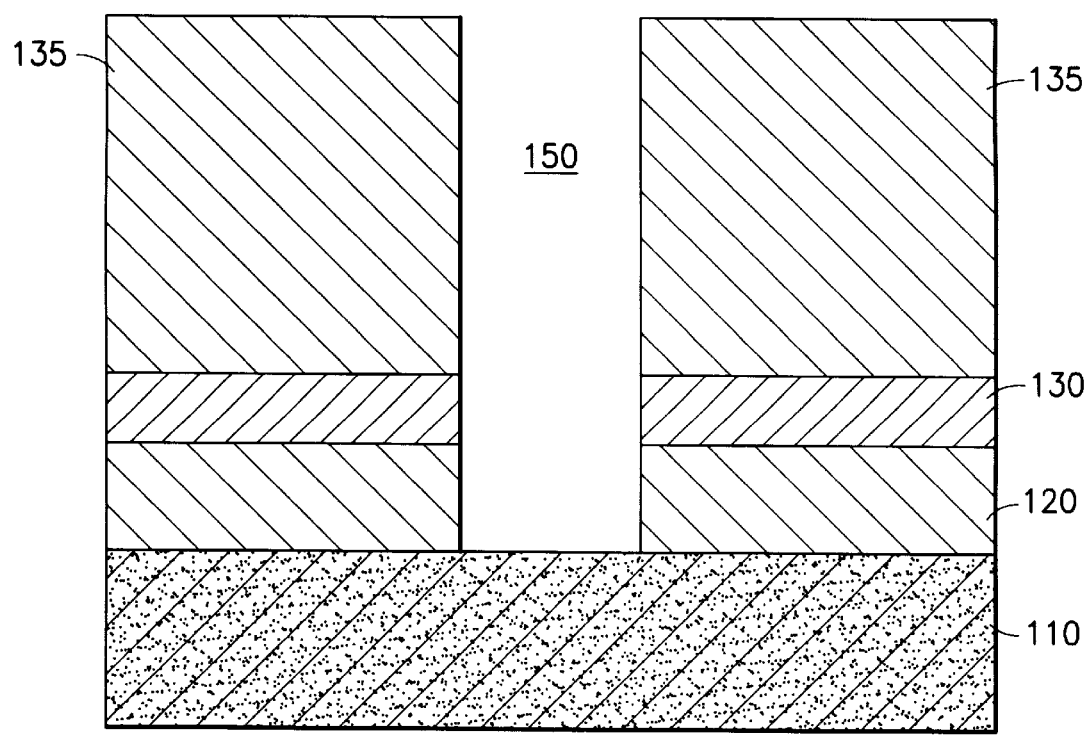

An alternative method is shown in FIG. 4, in which a layer of negative resist 140 has been patterned to form a trench having the pattern of the grid and a layer of gold 130 has been deposited over the substrate except for the thin (grid pattern) resist area. Next, in FIG. 5, resist 140 has been stripped and bonding layer 130 and smoothing layer 120 have been etched, leaving an aperture 150 having the shape of the target grid. The result of this version will be heavy scattering off the gold and low scattering in the grid region.

Those skilled in the art will readily be able to adjust the thickness of the gold layer to provide the contrast in scattered intensity that they need. While the invention has been described in terms of a single preferred embodiment, those skilled in the art will recognize that the invention can be practiced in various versions within the spirit and scope of the following claims.

We claim:

1. A method of manufacturing a scattering target for use with a particle beam system comprising the steps of:

providing a substrate having a top substrate layer of carbon;

depositing a smoothing layer on said top substrate layer;

patterning a negative photoresist with a target pattern, whereby said smoothing layer is exposed in said target pattern;

depositing a scattering layer of high atomic number in said target pattern;

stripping said photoresist to expose a background region of said smoothing layer; and removing said smoothing layer in said background region, whereby said target is surrounded by carbon in said background region.

2. A method according to claim 1, further including a step of polishing said smoothing layer.

3. A method according to claim 2, in which said surface roughness is less than 0.2 $\mu$m.

4. A method according to claim 1, further including a step of depositing a bonding layer on said smoothing layer, said bonding layer being adapted to bond to both said smoothing layer, and to said scattering layer.

5. A method according to claim 4, in which said step of depositing a bonding layer on said smoothing layer is effected by electroplating a layer of gold and said step of depositing said scattering layer is effected by electroplating a layer of gold.

6. A method according to claim 2, further including a step of depositing a bonding layer on said smoothing layer, said bonding layer being adapted to bond to both said smoothing layer and to said scattering layer.

7. A method according to claim 6, in which said step of depositing a bonding layer on said smoothing layer is effected by electroplating a layer of gold and said step of depositing said scattering layer is effected by electroplating a layer of gold.

8. A method of manufacturing a scattering target for use with a particle beam system comprising the steps of:

providing a substrate having a top substrate layer of carbon;

depositing a smoothing layer on said top substrate layer;

patterning a positive photoresist with a target pattern, whereby said smoothing layer is exposed outside a target of said photoresist;

depositing a scattering layer of high atomic number outside said target of photoresist;

stripping said photoresist to expose a target region of said smoothing layer; and removing said smoothing layer in said target region, whereby a target of carbon is surrounded by said scattering layer outside said target region.

9. A method according to claim 8, further including a step of polishing said smoothing layer.

10. A method according to claim 9, in which said surface roughness is less than 0.2 $\mu$m.

11. A method according to claim 8, further including a step of depositing a bonding layer on said smoothing layer, said bonding layer being adapted to bond to both said smoothing layer and to said scattering layer.

12. A method according to claim 11, in which said step of depositing a bonding layer on said smoothing layer is effected by electroplating a layer of gold and said step of depositing said scattering layer is effected by electroplating a layer of gold.

13. A method according to claim 9, further including a step of depositing a bonding layer on said smoothing layer, said bonding layer being adapted to bond to both said smoothing layer and to said scattering layer.

14. A method according to claim 13, in which said step of depositing a bonding layer on said smoothing layer is effected by electroplating a layer of gold and said step of depositing said scattering layer is effected by electroplating a layer of gold.

15. A scattering target for use with a particle beam system comprising:

a substrate having a top substrate layer of carbon;

a smoothing layer disposed on a target region of said top substrate;

a scattering layer of high atomic number disposed on said target region of said smoothing layer;

a background region of said top substrate layer outside said target region, whereby said target is surrounded by carbon in said background region.

16. A scattering target according to claim 15, further comprising a bonding layer between said smoothing layer and said scattering layer.

17. A scattering target according to claim 16, in which said scattering layer is selected from the group comprising gold and tungsten.

18. A scattering target according to claim 16, in which said smoothing layer is selected from the group comprising copper, silver and aluminum.

19. A scattering target according to claim 15, in which said top substrate layer has a thickness of greater than 3 $\mu$m and is disposed on a supporting substrate.

* * * * *